(12) United States Patent
Botti et al.

(10) Patent No.: US 7,113,606 B2
(45) Date of Patent: Sep. 26, 2006

(54) ADJUSTABLE HARMONIC DISTORTION DETECTOR AND METHOD FOR USING THE SAME

(75) Inventors: Edoardo Botti, Vigevano (IT); Mauro Cleris, Camponagara (IT); Antonio Grosso, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 910 days.

(21) Appl. No.: 09/943,414

(22) Filed: Aug. 30, 2001

(65) Prior Publication Data

US 2002/0109510 A1  Aug. 15, 2002

(30) Foreign Application Priority Data

Sep. 1, 2000  (EP) .................................. 00830596

(51) Int. Cl.
 *H04B 15/00* (2006.01)
 *H03G 5/00* (2006.01)
 *H03G 3/00* (2006.01)
 *H03F 1/26* (2006.01)
 *G01N 15/12* (2006.01)
 *H03L 5/00* (2006.01)
 *H03B 1/00* (2006.01)

(52) U.S. Cl. .................. 381/94.1; 381/94.2; 381/98; 381/61; 330/149; 327/13; 327/551; 327/317

(58) Field of Classification Search ............ 381/94.1, 381/94.2, 98, 61; 330/149; 324/623; 327/13, 327/317, 551, 552
See application file for complete search history.

(56) References Cited

U.S. PATENT DOCUMENTS

| 4,475,086 A | 10/1984 | Allen |
| 4,692,710 A * | 9/1987 | Shvartsman ................. 327/26 |
| 4,754,230 A | 6/1988 | Schwartz et al. |

FOREIGN PATENT DOCUMENTS

EP        0 295 497 A2    12/1988

OTHER PUBLICATIONS

European Search Report dated Jan. 26, 2001 for European Patent Application No. 00830596.

* cited by examiner

*Primary Examiner*—Vivian Chin
*Assistant Examiner*—Devona E. Faulk
(74) *Attorney, Agent, or Firm*—Lisa K. Jorgenson; Stephen Bongini; Fleit, Kain, Gibbons, Gutman, Bongini & Bianco P.L.

(57) ABSTRACT

There is provided an adjustable harmonic distortion detector that includes a clock signal source, means for the detection of a first period of evaluation, and means for the detection of a second period of evaluation. The detector has the characteristic that a first block memorizes a number equal to the clock pulses present in the first period of evaluation, a multiplier block performs a multiplication between the number stored in the first block and a multiplicative factor during the second period of evaluation, and a second block memorizes the outcome. The second block is adapted to generate an output signal when the outcome in the second block is equal to zero.

15 Claims, 4 Drawing Sheets

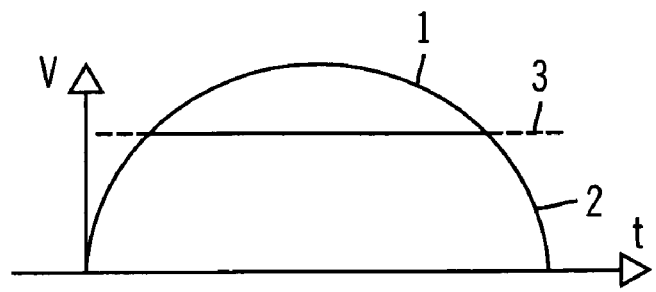
FIG. 1
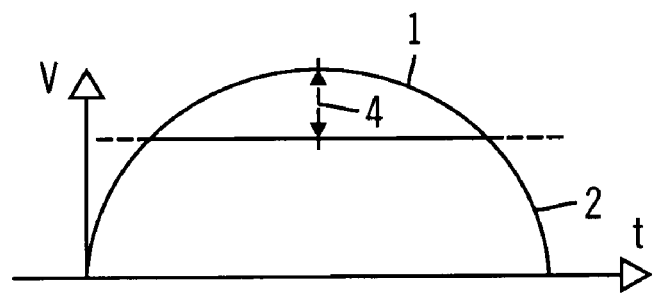
FIG. 2
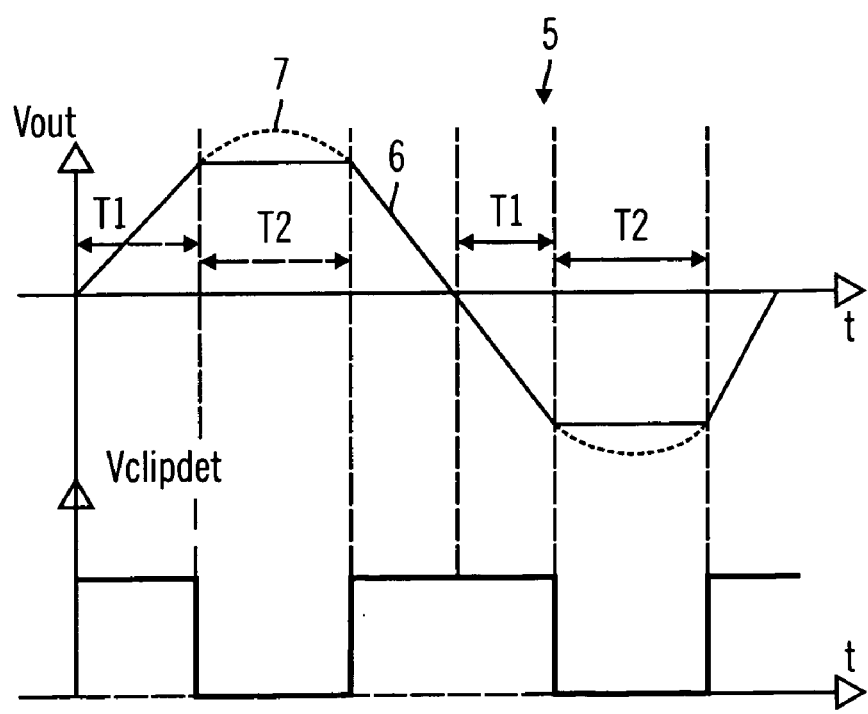
FIG. 3
FIG. 4

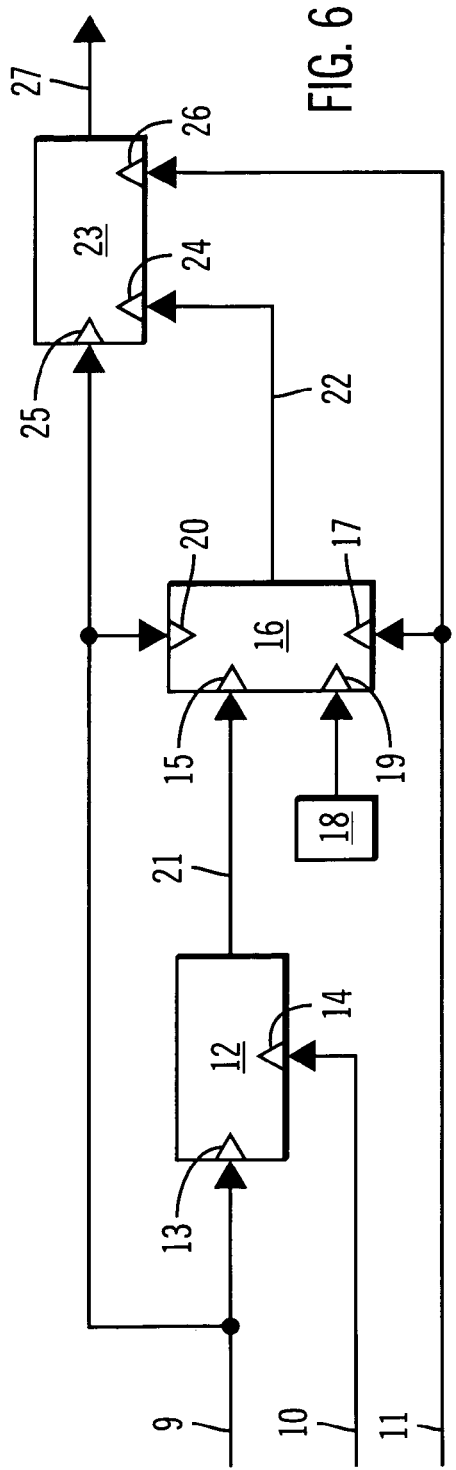
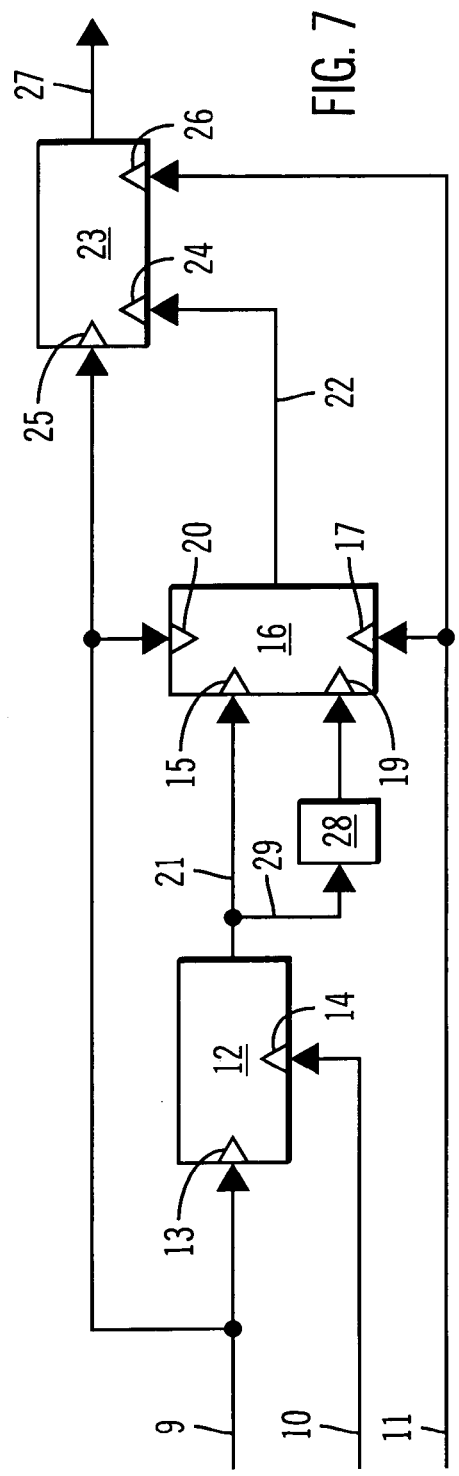

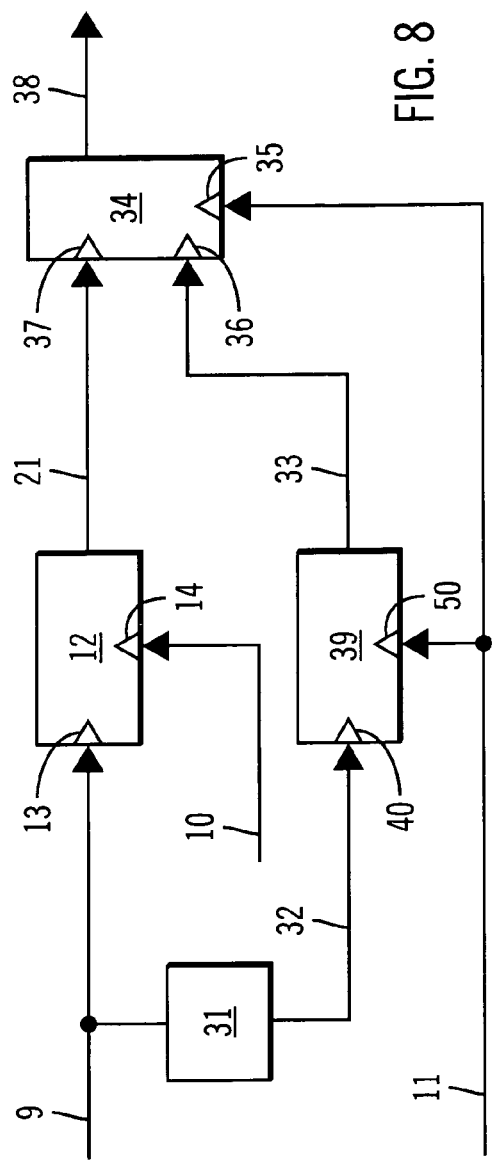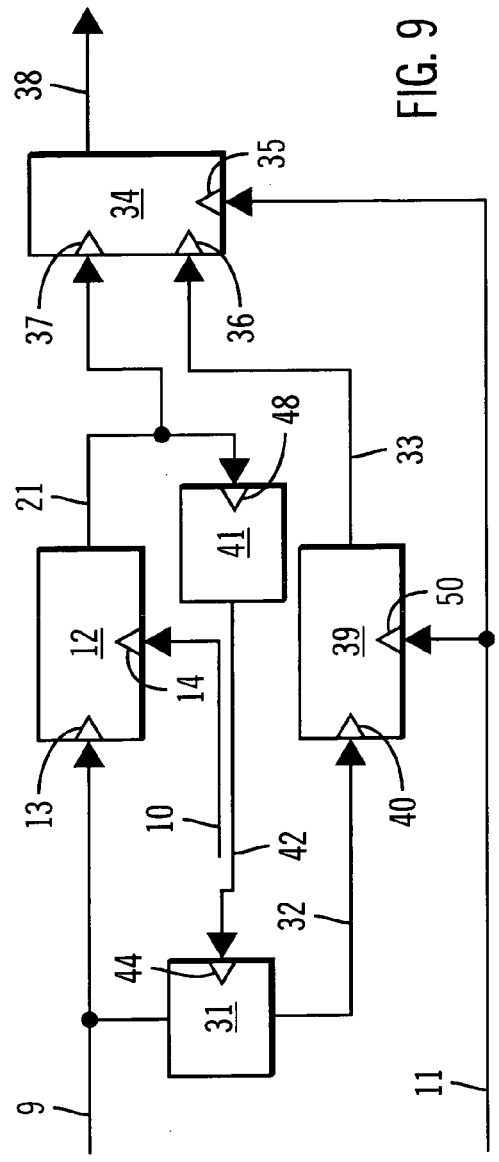

ADJUSTABLE HARMONIC DISTORTION DETECTOR AND METHOD FOR USING THE SAME

CROSS-REFERENCE TO RELATED APPLICATIONS

This application is based upon and claims priority from prior European Patent Application No. 00-830596.3, filed Sep. 1, 2000, the entire disclosure of which is herein incorporated by reference.

BACKGROUND OF THE INVENTION

1. Field of the Invention

The present invention relates to an adjustable harmonic distortion detector and method for using the same, particularly for linear (AB class) and switching (D class) amplifiers.

2. Description of Related Art

The term distortion designates any undesired deformation in the time trend of a signal and we distinguish two types of distortion: a) linear; and b) non linear.

The linear distortion happens when an input sinusoidal signal having a given amplitude and a given phase causes a still sinusoidal output signal having a different amplitude and/or phase.

The non linear distortion happens when an input sinusoidal signal causes an output signal which is no longer as such.

Particularly, in this last case, the distortion is measured in function of the deformation that the sinusoidal signal suffers, being founded on the possibility of dividing the deformed signal, into a sinusoidal oscillation having the same frequency (called fundamental oscillation) and into a number "n", with "n" rising to infinity, of oscillations having multiple frequencies of the fundamental (called harmonic oscillations).

We assume as convention, as a measure of the total harmonic distortion T.H.D., the ratio, usually expressed percent, between the total efficacious value of the harmonics and the efficacious value of the fundamental.

The distortion entity has a particular importance in the acoustic frequency amplifiers, that is for audio amplifiers, because it can modify the signal intelligibility.

An usual function in the audio amplifiers is the so called distortion detector function, called "clipping function", that has the role to detect when an amplifier has reached the peak power.

Using this information we can limit the distortions that a signal outgoing from the amplifier suffers, distortions due to the reached threshold of saturation of the same amplifier.

In this way by means of opportune circuits we can define "a priori" a fixed level of acceptable distortion, that is we can define at which distortion level the clipping function can interfere so as to reduce the amplifier gain, limiting, therefore, the distortion inside desiderated ranges.

The circuits now used are essentially of three categories: a) by a sensor of the saturation of the output power transistor of the audio amplifier, able to detect a distortion at a prefixed threshold value, as shown in FIG. 1 wherein we note an ideal output signal 1, a distorted signal 2 and a prefixed intervention threshold 3; b) by a comparison between the peak voltage of the input signal and the peak voltage of the same signal at the output of the audio amplifier when this last output signal is distorted, as shown in FIG. 2; c) by a measurement of the unbalance of the input pins of the audio amplifier (in fact during the normal working the input pins are at the same voltage, while when the amplifier saturates the pins assume a voltage difference that depends on the input signal amplitude).

The circuits heretofore described work correctly only in the case of AB class amplifiers, give troubles if the amplifier is D class and mostly if the amplifier is implemented in an integrated circuit wherein the output signal is not available inside the same integrated circuit.

SUMMARY OF THE INVENTION

In view of these drawbacks, it is an object of the present invention to overcome the above-mentioned drawbacks and to provide a circuit that is able to work with both linear and non linear amplifiers.

Moreover, an object of the present invention is to realize a circuit that is able to detect the reaching of the total harmonic distortion at the output of an amplifier.

According to preferred embodiments of the present invention, such objects are achieved by an adjustable harmonic distortion detector comprising a clock signal source, means for the detection of a first period of evaluation and means for the detection of a second period of evaluation, characterized in that a first block memorizes a number equal to the clock pulses present in the first period of evaluation, a multiplier block makes a multiplication between the number stored in the first block and a multiplicative factor during the second period of evaluation, a second block memorizes the result of the multiplication, the second block adapted to generate an output signal when the result in the second block is equal to zero.

Moreover, such objects are achieved by an adjustable harmonic distortion detector comprising a clock signal source and frequency multiplier/divider means, means for the detection of a first period of evaluation and means for the detection of a second period of evaluation, characterized in that a first block memorizes a number equal to the clock pulses present in the first period of evaluation, the frequency multiplier/divider means generate a modified clock signal, a third block counts the clock pulses present in the modified clock signal, a comparator compares the number stored in the first block with the number stored in the third block, the comparator adapted to generate an output signal when the comparison is equal to zero.

Moreover, such objects are achieved by a method to detect the harmonic distortion, characterized by computing the length of a first period of evaluation, computing the length of a second period of evaluation, receiving in input a prefixed value of total harmonic distortion so to generate an output signal showing the reaching of the value of the prefixed distortion.

Moreover, such objects are achieved by a method to detect the harmonic distortion, characterized by comprising the following steps: a) counting the number of clock signal pulses in a first period of evaluation; b) inserting the number in a first block; c) inserting a multiplicative factor in a second block; d) multiplying the value stored in the first block for the value stored in second block during a second period of evaluation; e) decreasing the outcome of the step (d) during second period of evaluation; and f) generating a signal in the case of the outcome of the step (e) is zero.

Moreover, such objects are achieved by a method to detect an harmonic distortion, characterized by comprising the following steps: a) counting the number of clock signal pulses in a first period of evaluation; b) inserting the number into a third block; c) modifying the clock signal into a modified clock signal; d) counting the number of modified clock signal pulses present in a second period of evaluation; e) inserting the outcome of the step (d) in a fourth block; f) comparing the outcomes of the steps (b) and (e) during second period of evaluation; and g) generating an output signal in the case the outcome of the phase (f) is equal to zero.

The present invention makes it possible to realize a circuit that is able to work both with AB class linear audio amplifiers and with D class audio amplifiers.

Moreover, it is possible to realize a circuit that controls the distortion of the output signal in function of the frequency of the same signal.

Moreover, it is possible to realize a completely integrated circuit, without the use of external capacities.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIG. 1 shows a voltage/time graph of a signal outgoing from a conventional audio amplifier;

FIG. 2 shows another voltage/time graph of a signal outgoing from a conventional audio amplifier;

FIG. 3 shows another voltage/time graph of a signal outgoing from a conventional audio amplifier;

FIG. 4 shows a voltage/time graph of a conventional clipping signal;

FIG. 6 shows a first embodiment of the circuit according to the present invention;

FIG. 7 shows a second embodiment of the circuit according to the present invention;

FIG. 8 shows a third embodiment of the circuit according to the present invention; and FIG. 9 shows a fourth embodiment of the circuit according to the present invention.

DETAILED DESCRIPTION OF PREFERRED EMBODIMENTS

Figure 5:
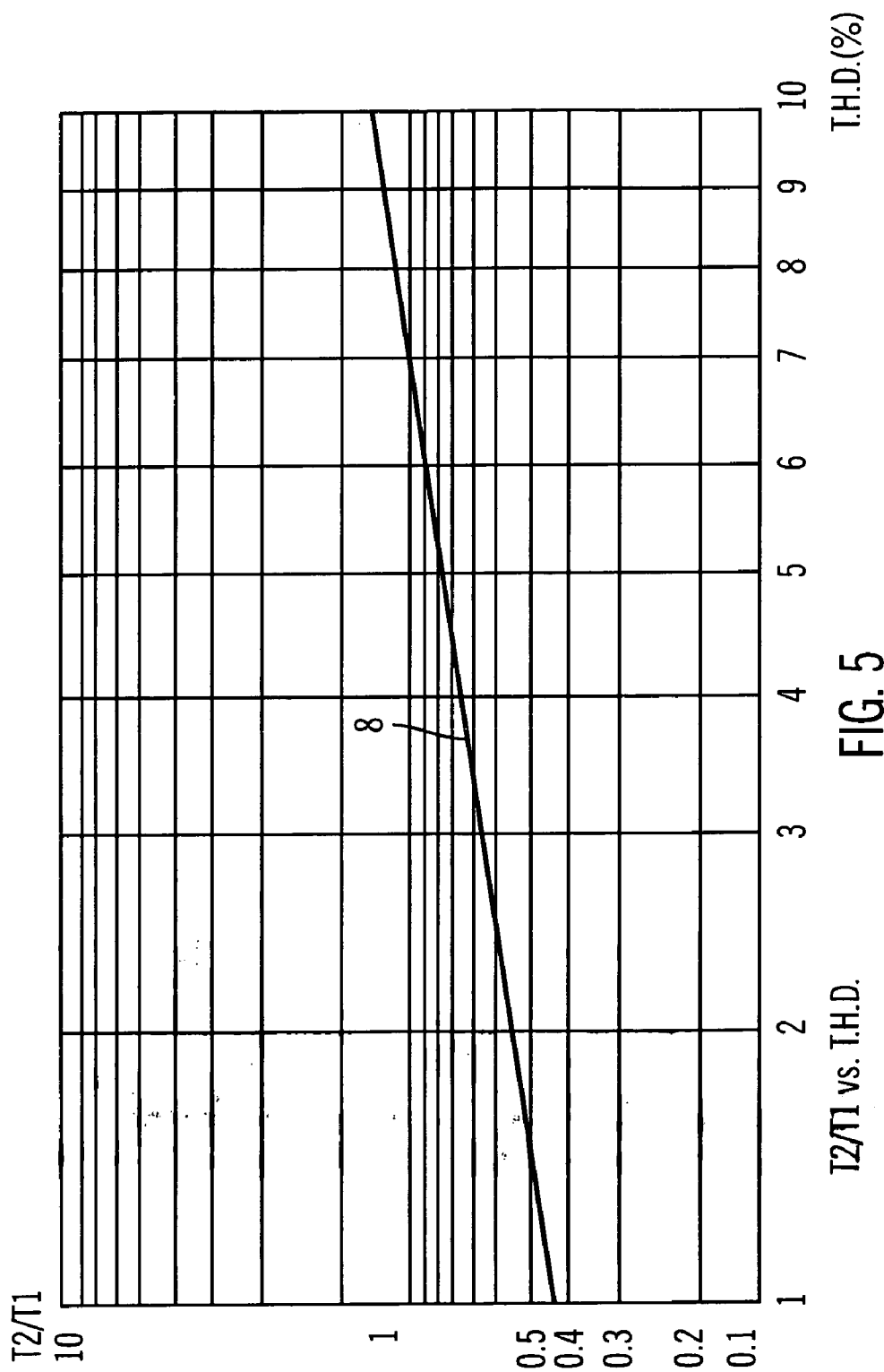
FIG. 5 shows a diagram according to the present invention.

Preferred embodiments of the present invention will be described in detail hereinbelow with reference to the attached drawings.

FIG. 3 shows a graph 5 having an abscissa axis indicating the time and an ordinate axis indicating the voltage. The graph 5 is formed by an output signal 7 that shows the output signal of an amplifier in the ideal case, that is in the case in which there aren't distortions, and by a distorted signal 6 due to the saturation of the amplifier.

We can identify, particularly, two time periods: 1) T1 adapted to provide the period length from the crossing of the abscissa axis to the start of the clipping phase, also called zero-crossing period; 2) T2 adapted to provide the period length from the start of the clipping phase to the end of the same, also called clipping period.

The period T2 establishes, as we can deduce from the FIG. 4, also the period of a square wave signal, also called detected clipping signal.

This signal is able to provide information on the distortion of the output signal 6 from the amplifier.

By a numerical simulation we have found that a correlation exists between the ratio of the clipping period length (T2) and the zero-crossing period length (T1) with the percent of the total harmonic distortion (T.H.D.). Moreover we have found that the correlation between (T2/T1) and T.H.D. is independent from the frequency of the distorted output signal 6 from the audio amplifier. Finally we have plotted the ratio (T2/T1) versus the distortion T.H.D. by means of a diagram, as shown in FIG. 5.

In the diagram of FIG. 5 we note an abscissa axis indicating the T.H.D., expressed in percent, and an ordinate axis indicating the dimensionless ratio T2/T1. We note also a curve 8 that has a trend which grows with the growth of the percent value of T.H.D.

The utility of such a diagram will be evident hereinafter in the description of the embodiments of the invention.

In FIG. 6 a first embodiment of the circuit according to the invention is shown.

In this Figure we note a clock signal 9 obtained from a local clock source (not shown in Figure), a zero-crossing signal 10 or period T1, deduced by crossing detector means for the abscissa axis of an input analog signal (not shown in Figure) and a clipping signal 11 or period T2, deduced by detector means known to a skilled person.

The zero-crossing signal 10 by through a reset/enable pin 14 sets to zero the content of a block 12 of increment type, also called up counter, and determines the start of the counting of the clock signal 9 through a data input pin 13.

The block 12, therefore, starts to count from zero the clock signal pulses with a counting rate equal to the clock frequency. The block 12 stores the pulse numbers included in every output signal which crosses the abscissa axis, both in the case of positive and negative half-wave.

In this way the block 12 contains a number indicative of the rapidity of the distorted output signal 6 from the audio amplifier during the evaluation period T1.

The output 21 of the block 12, during the period T2, sets the number of clock pulses of the signal 9, counted in the period T1, in a first register 15 of a multiplier block 16.

In a block 18, a user has previously stored a numeric value that represents the harmonic distortion level that we want as top threshold. This value is deduced from the diagram shown in FIG. 5.

The block 18 can be implemented, for example, as a ROM device (Red Only Memory).

For example, if we want to have a T.H.D. equal to 5%, that is a total harmonic distortion of the signal equal to 5%, a value equal to 0.9 must be present in the block 18, as we deduce from the diagram of FIG. 5.

The multiplier block 16, therefore, makes a multiplication operation between what is stored in the first register 15 and what is stored in a second register 19. In the second register there is the number chosen by the user and stored in the block 18, that is in the second register there is a multiplicative factor by means of which it is possible to establish the correlation between the ratio T2/T1 and T.H.D.

In order that the block 16 makes the operation of multiplication the signal clock 9 and the clipping signal 11 must provide simultaneously the qualification, by, respectively, a pair of enable pins 20 and 17.

The output 22 of the block 16 is then loaded in a block 23 of decreasing type, also called down counter, by means of a data input pin 24.

The block 23 decreases, with a decreasing rate equal to the frequency of the clock signal 9, the output 22 received in input for all the time during which the clipping signal 11 is turned on, that is for all the length of the period T2.

The qualification to the decreasing operation of the computed value by the block 16, is obtained by means of the simultaneously combination of the clock signal 9 and the clipping signal 11, by, respectively, a pair of pin 25 and 26.

When the value stored in the block 23 reaches the zero, the output 27 is activated giving the information of the reaching of the fixed T.H.D.

During the period T2, in the case the value stored in the block 23 does not reach the zero or the clipping signal 11 is not turned on, the block 23 does not generate any signal.

If the output signal 27 is high and the period T2 is not completely elapsed, the output signal 27 remains high until the period T2 is elapsed.

The invention, in this particular embodiment, therefore consists in counting how many clock pulses are present in the distorted output signal 6 during the period T1, multiplying the value for a number, known a priori, deduced from the experimental diagram of FIG. 5 and finally generating an output signal 27 in the case of the block 23 reaches the zero inside the period T2, so to generate the output distortion detector signal 27.

Therefore the down counter 23 generates the signal 27 when the input signal 22 has reached the fixed value T.H.D. or the equivalent ratio T2/T1 deduced from the diagram of FIG. 5.

In the case we want a detection of the distortion in function of the frequency of the distorted output signal 6 of the amplifier, that is, in the case we want to detect the distortion not as a fixed value but as a value variable in function of the rapidity of the front of the signal, the circuit previously shown must be modified as that shown in FIG. 7.

In FIG. 7, besides elements already described in FIG. 6, a block 28 having an input signal 29, that represents the number of clock pulses stored by the block 12, and an output signal 30, that represents the value being in the second register 19 of the multiplier block 16, is shown.

The block 28 makes a correspondence function between the number of the clock pulses counted during the measure period of the block 12, that is during the period T1, and the diagram shown in FIG. 5.

The block 28, therefore, realizes a reference table between the number of counted clock pulses during T1 and the diagram of FIG. 5.

The block 28 can be implemented by a ROM type device or by a microprocessor.

The block 28 defines a table so that a determined value of the ratio T2/T1 corresponds to every particular number of counted clock pulses, so as to detect how much the front side of the sinusoidal signal outgoing from the amplifier is steep.

For example, a possible table can be as:

| Num. of Clock Pulses | T2/T1 or T.H.D. |
|---|---|
| 36900 | 0.4 |
| 11–100 | 1 |
| 101–1000 | 1.2 |

In this way we obtain a multiplicative factor which is a function of the number of the counted clock pulses.

The invention, in this particular embodiment, therefore consists in counting how many clock pulses are present in the distorted output signal 6 during the period T1, multiplying the value for a number which is a function of the counting and is deduced from the experimental diagram of FIG. 5 and finally generating the output signal 27 in the case of the block 23 reaches the zero inside the period T2, so to generate the output distortion detector signal 27 in function of the frequency of the output distorted signal 6.

In the case during the period T2, the value stored in the block 23 does not reach the zero or the clipping signal 11 is not turned on, the block 23 does not generate any signal.

If the output signal 27 is high and the period T2 is not completely passed, the output signal 27 remains high until the period T2 is passed.

In FIG. 8 another embodiment of the circuit according to the present invention is shown.

As shown in this Figure, besides elements already described in FIGS. 6 and 7, we note that the clock signal 9 is counted by the block 12, during the period T1, as described previously in FIG. 6, and that the clock signal 9 is also the input of a block 31.

The block 31 generates an output clock signal 32 modified in frequency, that is the block 31 acts as a frequency multiplier or divider.

For example the clock signal 32 is equal to 3/2 of the clock signal 9 so as to obtain a ratio T2/T1 equal to 0.4.

The modified clock signal 32 is counted by another block 39 of up counter type during the period T2. In fact the block 39 receives in input the signal 32, by means of a reset/enable pin 50, and starts the counting of the clock pulses from zero, by means of a data input pin 40.

The outcomes stored in the blocks 12 and 39 are set on the respective outputs 21 and 33 that act as input signals for a block 34, by means of respective input pins 37 and 36.

The block 34 has also in input, by means of the pin 35, the clipping signal 11.

The block 34 compares the input signals 21 and 33 during the period T2 and it generates an output signal 38 when the output signals 21 and 33 have an equal value.

Therefore the comparator block 34 sets on the output 38 the detector pulse, function of the ratio between the frequency values of the clock signal 9 and of the modified clock signal 32.

The circuit shown in FIG. 8 is convenient in those cases wherein the T.H.D. does not change continuously, that is a circuit particularly suitable for those cases in which we have some fixed points for the intervention T.H.D. threshold.

Moreover it also advantageous with respect to the circuit shown in FIG. 7 because it does not foresee the use of a multiplier block 16 but it foresees the use of a comparator block 34 of simplified construction.

For example in this particular embodiment we have that the ratio T2/T1 is given by the frequency ratio of the clock signal 9 and the modified clock signal 32.

If the frequency of the clock signal 9 is equal to the frequency of the modified clock signal 32, then the circuit detects a T.H.D. equal to the 6% because T1/T2=1. We deduce from the diagram of FIG. 5 the T.H.D. value equal to 6%.

The invention, in this particular embodiment, therefore consists in counting how many clock pulses are present in the distorted output signal 6 during the period T1, and counting how many pulses of modified clock signal pulses 32 are present during the period T2, comparing the counts by means of the comparator block 34 until they are both equal to zero during the period T2, so as to generate an output distortion detector signal 38.

Therefore the comparator 34 generates the signal 38 when the input signals 21 and 33 reach the prefixed value T.H.D. or the equivalent ratio T2/T1 deduced from the diagram of FIG. 5.

During the period T2, in the case the value stored in the block 34 does not reach the zero or the clipping signal 11 is not turned on, the block 34 does not generate any signal.

If the output signal 38 is high and the period T2 is not completely elapsed, the output signal 38 remains high until the period T2 is elapsed.

In FIG. 9 another embodiment of the circuit of FIG. 8 is shown and particularly there is a block 41 that receives in input the signal 21 that represents the counting made by the block 12 during the period T1.

The block 41 is a reference table between the number of counted clock pulses during the measure period of the block 12 and the diagram shown in FIG. 5.

For example, a possible table can be as:

| Num. of Clock Pulses | T2/T1 or T.H.D. |
|---|---|
| 36900 | 0.4 |
| 11–100 | 1 |
| 101–1000 | 1.2 |

The block 41 is implemented as a ROM device or as a microprocessor device.

The block 41 generates an output signal 42 that is set in input to the block 31, by means of a data input pin 44. The block 31 itself generates a modified clock signal 43 so to that the signal 43 is a function of the length of the period T1.

The signal 43 is set in input to the block 39 of up counter type, by means of a data input pin 40, and it is enabled to the counting by the clipping signal 11, by means of the erase/enable pin 50.

The block 39 generates an output signal 47 that is set in input to the comparator block 34 so that the comparison between the signal 47 and the signal 21 is made.

The block 41, as previously described in FIG. 7, gives to every number of counted clock pulses a value deduced from the diagram of FIG. 5 and the value serves to the block 31 to decide how to change the clock signal 9.

Therefore the comparator block 34 sets on the output 38 the detector pulse, in function of the ratio between the frequency values of the clock signal 9 and of the modified clock signal 32.

The circuit shown in FIG. 9 is convenient in those cases in which the T.H.D. changes continuously, that is it is a circuit particularly suitable for those cases in which we have a curve as reference for the T.H.D. threshold of intervention.

The invention, in this particular embodiment, therefore consists in counting how many clock pulses are present in the distorted output signal 6 during the period T1, and counting how many pulses of modified clock signal 42, function of the counting of the clock signal 9 during the period T1, are present during the period T2, comparing the counts by means of the comparator block 34 until they are equal to zero during the period T2, so as to generate an output distortion detector signal 38, in function of the frequency of the distorted output signal 6.

During the period T2, in the case of the value stored in the block 34 does not reach the zero or the clipping signal 11 is not turned on, the block 34 does not generate any signal.

If the output signal 38 is high and the period T2 is not completely elapsed, the output signal 38 remains high until the period T2 is elapsed.

By means of simple combinatory circuits, we can also determine the length of the pulse of the T.H.D. value at multiplies of the frequency of the signal clock or we can cause the pulse to start at the reaching of the value of T.H.D., and the T.H.D. signal to remain high until the period T2 is elapsed.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An adjustable harmonic distortion detector comprising:
    a clock signal source;
    means for detecting a first period of evaluation;
    means for detecting a second period of evaluation;
    a first block for storing a number equal to the clock pulses present in the first period of evaluation;
    a multiplier block for performing a multiplication between the number stored in the first block and a multiplicative factor during the second period of evaluation; and
    a second block for storing the outcome of the multiplication, the second block adapted to generate an output signal when the value stored in the second block is equal to zero.

2. The distortion detector according to the claim 1, wherein the multiplicative factor is a fixed number.

3. The distortion detector according to the claim 1, wherein the multiplicative factor is a function of the number of clock signal pulses stored in the first block.

4. The distortion detector according to the claim 1, wherein the multiplicative factor is deduced from the correlation between the ratio of the second and first period of evaluation and the total distortion value according to a diagram.

5. The distortion detector according to the claim 1,
    wherein the first block receives in input the clock signal, and the first evaluation period,
    the multiplier block receives at input the clock signal, the multiplicative factor, and the output signal of the first block, and
    the second block receives at input the clock signal, the output signal of the multiplier block, and the second evaluation period, and produces an output signal during the simultaneous combination of the clock signal and the second evaluation period.

6. The distortion detector according to the claim 1,
    wherein the first block receives at input the clock signal, and the first evaluation period,
    the multiplier block receives at input the clock signal, the second evaluation period, and a signal generated by a fourth block adapted to realize a correspondence function between the number of clock pulses stored in the first block and the diagram, and
    the second block receives at input the clock signal, the output signal of the multiplier block, and the second evaluation period, and it produces an output signal during the second evaluation period.

7. The distortion detector according to claim 1, wherein the first evaluation period provides the length from the crossing of the abscissa axis to the start of the distortion step of the output signals.

8. The distortion detector according to claim 7, wherein the second evaluation period provides the length from the start of the distortion step to the end of the same of the output signals.

9. The distortion detector according to claim 1, wherein the first block is an up counter.

10. The distortion detector according to claim 9, wherein the second block is a down counter.

11. The distortion detector according to claim 10, wherein a fourth block is coupled to an input of the multiplier block, the fourth block making the correspondence function between the number of clock pulses stored in the first block and the diagram.

12. A method for detecting harmonic distortion, said method comprising the steps of:

counting a number of clock signal pulses in a first period of evaluation;

storing the number in a first block;

multiplying the number stored in the first block with a multiplicative factor during a second period of evaluation;

decreasing the outcome of the multiplying step during the second period of evaluation;

generating a signal in the case that the outcome of the decreasing step is zero.

13. The method according to the claim 12, wherein the multiplicative factor is a fixed number.

14. The method according to the claim 12, wherein the multiplicative factor is a function of the number stored in the first block.

15. The distortion detector according to claim 1, wherein, during the second period of evaluation, the second block decreases the value stored in the second block, and generates the output signal when the value stored in the second block reaches zero.

* * * * *